United States Patent [19]
Van Alstine et al.

[11] Patent Number: 5,909,182
[45] Date of Patent: Jun. 1, 1999

[54] VANDAL RESISTANT LIGHT SIGNAL UNIT

[75] Inventors: Daniel W. Van Alstine, Livonia; David A. Donatello, Mendon; Mark Hager, Rochester, all of N.Y.

[73] Assignee: Alstom Signaling Inc., Rochester, N.Y.

[21] Appl. No.: 09/154,978

[22] Filed: Sep. 17, 1998

Related U.S. Application Data

[63] Continuation-in-part of application No. 08/752,963, Dec. 2, 1996, abandoned.

[51] Int. Cl.$^6$ .................................................. G08B 5/36
[52] U.S. Cl. ............................ 340/815.52; 340/815.45; 340/815.53; 340/815.56; 345/82; 345/83
[58] Field of Search ..................... 340/815.52, 815.56, 340/815.45, 815.4, 815.53, 815.69, 815.75; 345/82, 83

[56] References Cited

U.S. PATENT DOCUMENTS 4,271,408  6/1981  Teshima et al. ........................ 345/83
4,298,869  11/1981  Okuno ..................................... 345/82
5,859,592  1/1999  Carlin ................................. 340/815.45

*Primary Examiner*—Edward Lefkowitz
*Assistant Examiner*—Davetta Woods
*Attorney, Agent, or Firm*—Ohlandt, Greeley, Ruggiero & Perle

[57] ABSTRACT

A vandal resistant light signal unit consisting of a modular integrated circuit arrangement having an insulative circuit board, which has a first broad area layer of conductive material on one side of the circuit board and a second broad area layer on an opposite side of the circuit board. The first layer defines a positive energy plane and the second a negative energy plane. Also, the unit has a plurality of independent series circuits connected in parallel to respective spaced points or nodes on the oppositely located layers of conductive material. Moreover, the broad area layers are connected to opposite sides of a power supply, and these layers constitute an arrangement for resisting vandalism occasioned by projectiles directed at said light signal unit.

8 Claims, 5 Drawing Sheets

VANDAL RESISTANT LIGHT SIGNAL UNIT

BACKGROUND OF THE INVENTION

This application is a continuation-in-part of application Ser. No. 08/752,963, now abandoned.

This invention relates to light signals typically used at highway grade crossings in railroad systems and more particularly to arrays of LEDs; that is, light-emitting diodes, serving in such devices for the intended purpose.

It has been the practice over a great number of years to employ light signals along railroad rights-of-way and, particularly at highway grade crossings, in order to furnish a warning to vehicles that intend to cross the tracks. One of the major problems with the light signals thus employed is that they are subjected quite often to a degree of vandalism that results in the signal being knocked out—in the sense of not being available to serve as a warning to traffic intent on crossing the railroad tracks. In the recent past the more or less conventional light units have given way to light-emitting diode units. However, when these are deployed they are subject to the same effects of vandalism and as a result can have a low level of reliability.

In order to finish the man skilled in the art with background material in regard to the present invention reference may be made to the following U.S. patents which disclose a variety of light emitting diode displays and the circuitry therefor:

U.S. Pat. Nos. 4,298,869 4,774,434 5,450,301 5,457,450

Of particular interest to the present invention are U.S. Pat. Nos. 4,298,869 and 5,457,450 in that they illustrate the deficiency in certain light signals, namely, that they could be subject to a degree of vandalism that makes them unreliable. This is due to the fact that the circuitry is, first of all, exposed to the likelihood of a perpetrator's B—B or bullet striking the unit and causing a large number, if not all, of the LEDs in the unit to lose power and go dark. Thus a lucky shot could unfortunately strike at a point any where along a critical line conductor; for example, leading from the power supply to the LEDs (see, for example, the lead or line conductor between the battery and the section designated 13" in FIG. 6B of patent '869), thereby causing total failure of the light signal to provide normal illumination.

Accordingly, it is a primary object of the present invention to provide a light signal that will be extremely resistant to vandalism, thus providing a much higher level of reliability.

Another object is to capitalize on integrated circuit techniques, so as form in the broad area layers of conductive material that are provided for the purpose of vandalism resistance a series of conductive islands needed for establishing connections among the several components in the light signal unit.

Yet another object is to fully protect the light signal unit against blows that might be struck by the use of a baseball bat or similar weapon against the housing of the light signal unit. This is accomplished by having a very strong plastic dome-like covering for the housing, such cover being transparent so as to permit passage of the needed warning light signal.

An ancillary object is to provide for universal installation of a LED module such that it can be installed in completely newly fabricated units or it can be retire-fitted to existing highway grade crossing light signals, being adapted to fit a number of different sized, already existing, units of different manufacturers.

SUMMARY OF THE INVENTION

The above and other objects are achieved by the present invention through a design which essentially consists of a printed circuit board with LEDs that mount in a signal housing and which includes a clear piano protective lens to replace the outer roundel normally found in an existing light signal units.

The afore-noted design is realized through the provision of multiple independent series circuits, including LEDs and resistors, connected to common reference points such that they are in parallel with each other. The circuit arrangement, including the multiple series circuits, is mounted on a printed circuit board which includes a negative energy plane on one side and a positive energy plane on the other side. This will become clear as the description proceeds.

What is essentially accomplished by this arrangement is a virtually infinite power path to each circuit. Consequently, this configuration will allow the light signal unit to sustain multiple punctures and failures of individual LEDs with minimal impact on the remainder of the circuit. In other words, although a perpetrator might be successful in the sense that one or more lucky shots might knock out certain of the series circuits, the common lead in to the series circuits is formed in a positive plane, being formed as a metal layer and occupying a very wide area such that a lucky shot, or even a fairly large number of shots, would not break all connections to the series circuits. Likewise, the "lead out" from the series circuits is formed in a "negative plane", again being formed as a metal layer and occupying a very broad or wide area.

The major feature of the invention is broadly defined as follows:

A vandal resistant light signal unit comprising a modular integrated circuit arrangement having an insulative circuit board, a first broad area layer of conductive material on one side of the circuit board and a second broad area layer on an opposite side of the circuit board, the first layer defining a positive energy plane and the second a negative energy plane. Also, there are a plurality of independent series circuits connected in parallel to respective spaced points or nodes on the oppositely located layers of conductive material, these broad area layers being connected to opposite sides of a power supply Further the layers constitute a means for resisting vandalism occasioned by projectiles directed at said light signal unit.

Alternately, the noted objectives could also be accomplished by the use of "redundant traces", i.e., spaced conductive strips having a common connection, as will be explained, rather than completely continuous broad area, planar configuration of metallic material.

Another feature resides in the provision of having the metal layers, which act principally as ohmic contacts for the independent series circuits, also serve to enable the forming of connections between circuit elements. This is achieved simply by the etching out of islands of material from the metal layers.

A further feature already mentioned is that the printed circuit board can have multiple hole patterns for mounting, such that a single design unit can be mounted in housings of a variety of different manufacturers.

Other and further objects, advantages and features of the present invention will be understood by reference to the following specification in conjunction with the annexed drawings, wherein like parts have been given like numbers.

DESCRIPTION OF PREFERRED EMBODIMENT

Figure 1:
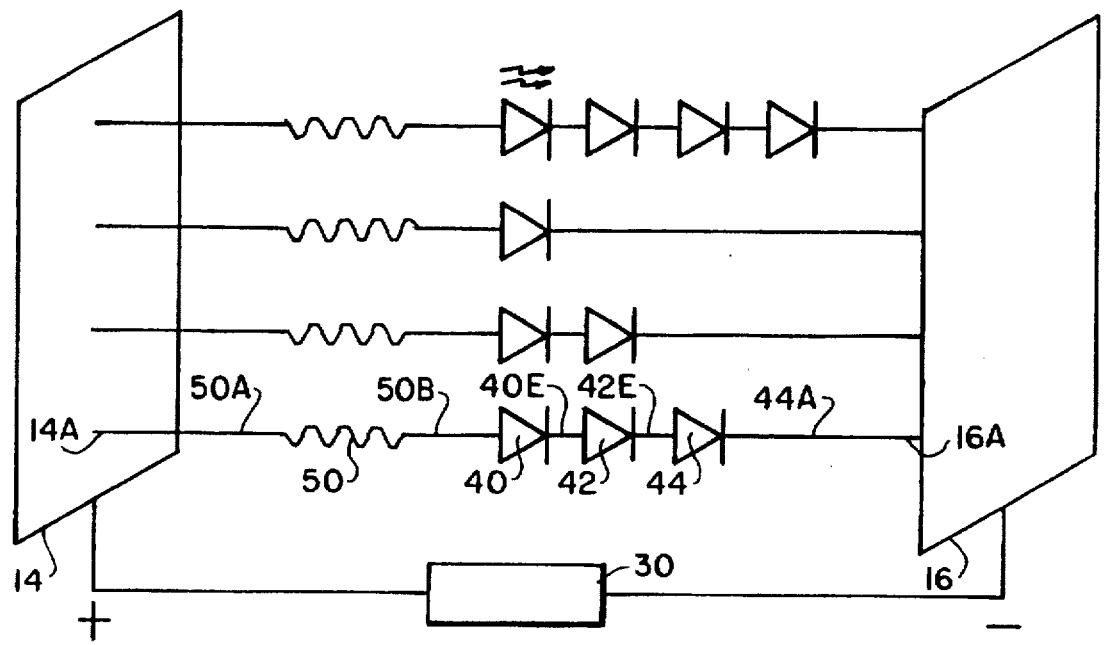
FIG. 1 is a schematic design of a preferred embodiment of the light signal circuit having positive and negative power planes formed as whole or continuous, broad area, metal layers or sheets.

Referring now to the Figures of the drawing, there will be seen in FIG. 1 a perspective view of an integrated circuit module 10 for the light signal unit of the present invention in its preferred embodiment. This module contains an array of LED circuits for providing a high intensity light as a warning signal. As particularly shown in the cut away pie-shaped portion 10A of FIG. 1 and in the exploded view of FIG. 4, the integrated circuit module comprises a series of layers of material, one of which is a comparatively thick insulative circuit board 12. Adhered or attached to the upper and lower surfaces of the insulative board 12 are two, broad area, thin conductive layers or sheets of copper or the like, such layers or sheets being designated 14 and 16. Overlaying the upper copper layer 14 is a protective plastic layer 18; acting as a solder mask below the copper layer 16 is another plastic layer 20.

The typical integrated circuit module 10 has DC power supplied to it from a power supply 30 seen in FIG. 1, comprising a full wave rectifier whose ends are connected respectively to the positive plane of the circuit represented by copper layer 14 and the negative side represented by the copper layer 16.

Figure 2:
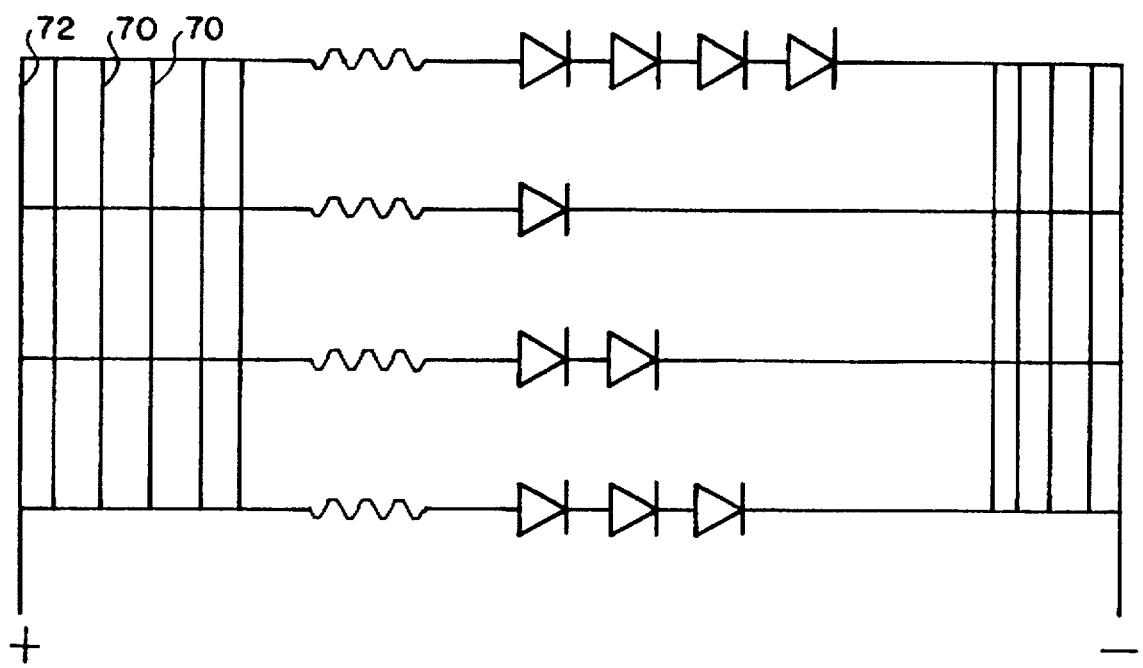
FIG. 2 is an alternate approach to FIG. 1 using many redundant circuit traces.
Figure 4:
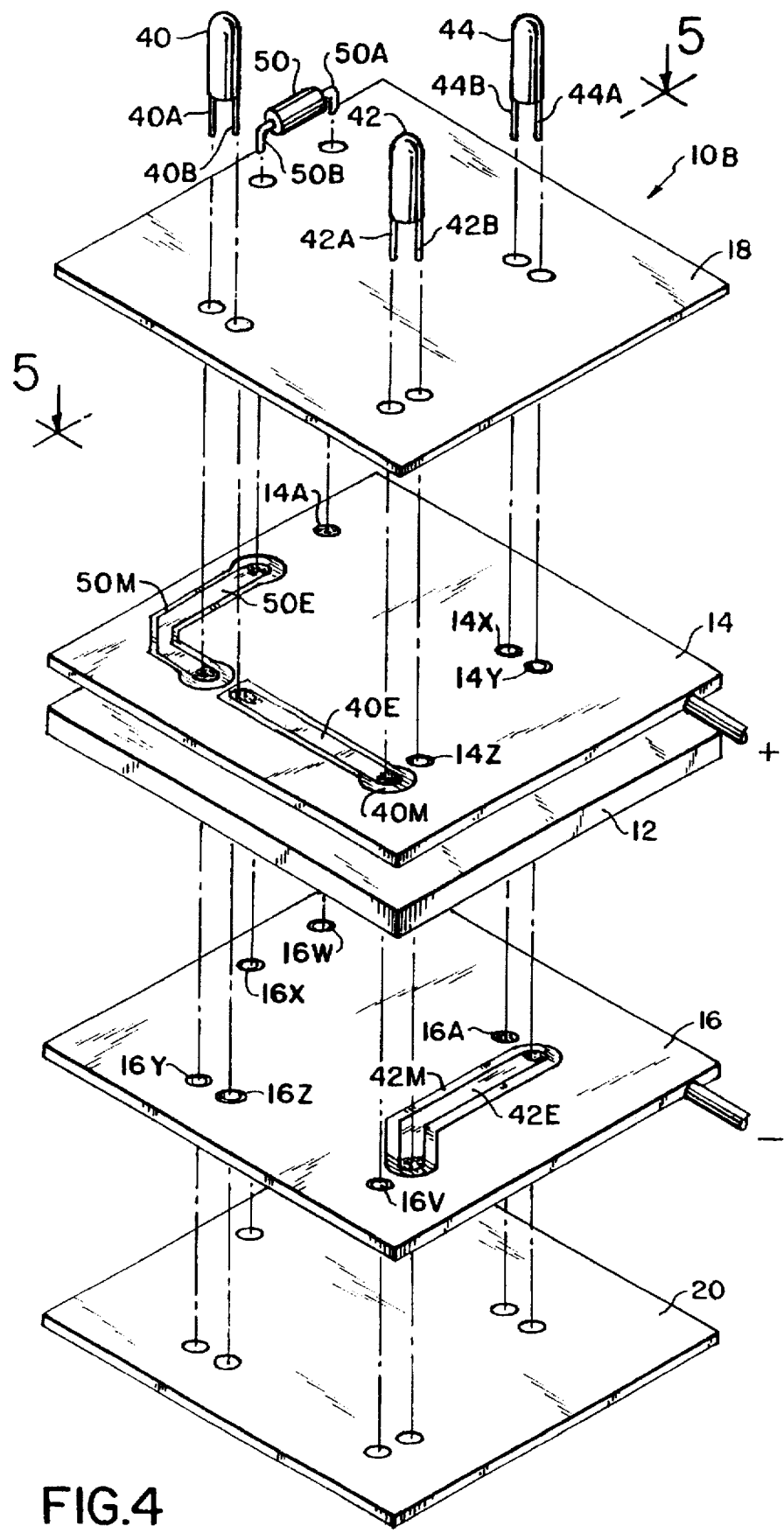
FIG. 4 is an exploded view of an exemplary portion of the light signal module, being helpful in understanding the topography and the method of achieving it.
Figure 5:
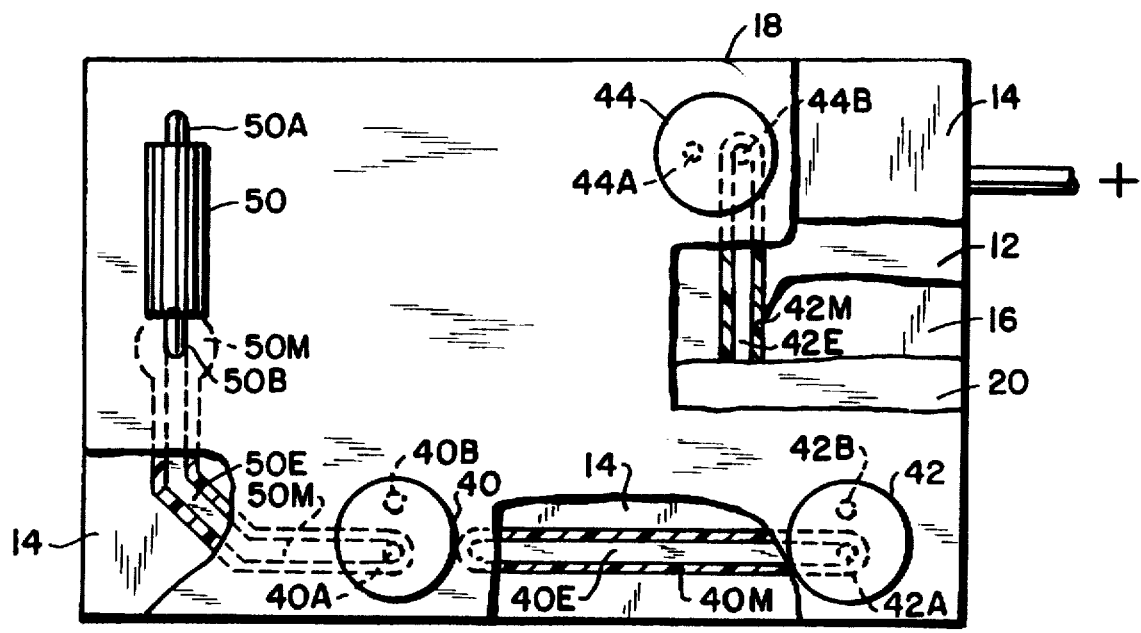
FIG. 5 is a partial, broken away, plan view of the light signal module.

The typical integrated circuit module would have approximately 72 series circuits (although such are not individually seen in the Figure) with, for example, three light emitting diodes connected in each series circuit. However, as shown by the schematic diagrams of FIGS. 1 and 2, a variable number of diodes could be selected for each of the individual series circuits. Accordingly, referring to FIG. 1, a three diode arrangement would include diodes 40, 42 and 44, and a resistor 50 all in series between the positive and negative sides of the power supply 30. Referring now to FIG. 4, the diodes 40, 42, 44 and resistor 50 are located or disposed above the upper plastic layer 18, the left end of the resistor 50, as seen in FIG. 2, being connected at node or point 14A on the broad conductive layer 14 (positive plane). This connection is also seen in the schematic diagram of FIG. 2.

Figure 3:
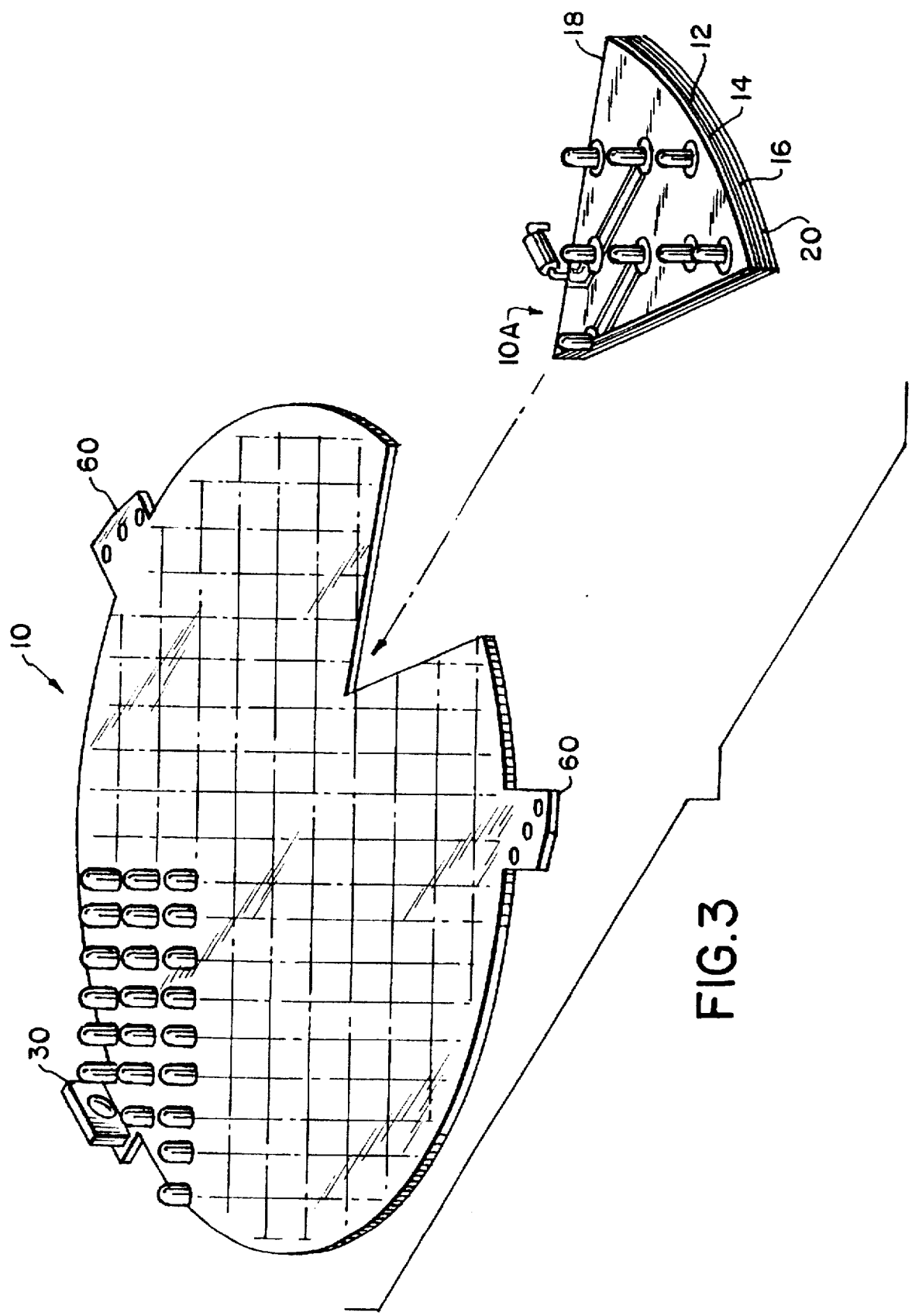
FIG. 3 is a perspective view of the light signal module, broken away to show the several parts within the module, and in which LEDs and resistors are connected in an array of series circuits which are connected in parallel with each other by end connections to the positive and negative power planes at spaced nodes or points thereon.

The complete topography of the module can be appreciated by the perspective view of FIG. 3 of the complete module and the exploded view of an exemplary portion 10B of the circuit module. There will be seen a conventional insulative board 12 commonly used in the printed and integrated circuit arts, such board being suitably processed by conventional techniques so as to provide an upper metal layer 14 on the top side of the board 12 and a corresponding metal layer 16 on the opposite or underside of the insulative board. For interconnection purposes, that is, in order to connect the resistor 50 and the light-emitting diodes 40, 42 and 44, it will be understood that the metal layers 14 and 16 extend over the entire plane or area of the circuit module 10 (FIG. 3) so that a large number of series circuits, for example, 72 circuits, can be accommodated. Thus, all of the series circuits are connected at a multiplicity of points 14A (FIG. 1) on the layer 14 as well as at the corresponding points or nodes 16A on the layer 16.

In addition to the broad area ohmic contacts constituted by layers 14 and 16, there is formed within these layers discrete islands, for example, 40E and 50E in layer 14 and 42E in layer 16 for purposes to be explained.

The correspondence between the schematic diagram of FIG. 1 and the topographic, exploded, fragmentary view of FIG. 4 will be understood: for example, the connection or lead 50A seen in FIG. 2 in the illustrated series circuit is likewise seen at the right or far end of resistor 50 in FIG. 4. The exemplary series circuit can be traced out by beginning at the plus side of the power source 30, such plus side being connected to layer 14 in FIG. 4, at contact or node 14A; thence to the lead 50A of resistor 50. The other end of resistor 50 has a lead 50B which extends downwardly through the plastic layer 18, penetrating such layer and extending through layer 14, then the insulative board 12, layer 16 and plastic layer 20. It will be seen that all of the leads or connections from all of the components, that is, from resistor 50 and diodes 40, 42 and 44 extend all the way down through the plastic layer 20 and to the bottom of the module.

It will be noted that lead 50B from resistor 50 extends downward to make contact with 50E at the layer 14, thence with 40A of LED 40. From the other side of LED 40, lead 40B extends downwardly through the plastic layer 18 to make electrical contact with and to the island 40E, which is surrounded by a plastic moat 40M. This insures that island 40E, which is formed from the metal layer 14, is isolated from the substantial ohmic contact, or positive plane, part of the layer 14. Accordingly, no short circuits will exist.

From the near end of metal island 40E, lead 42A which makes electrical contact with that island, extends upward to LED 42. The other side of LED 42 is connected by means of lead 42B to another island 42E which has been similarly formed in metal layer 16, whence series connection is made from the far side of that metal island 42E by lead or conductor 44A to LED 44. Thence, lead or conductor 44B completes the circuit from LED 44 to the node or point 16A on the negative plane (ohmic contact) 16. The negative side of the source 30 connects to the negative plane 16.

It should be noted that in having various leads or conductors passing through the metal layers suitable isolation must be provided so as to avoid short-circuiting. Accordingly, once the three layers, that is, the insulative board 12 and the metal layers 14 and 16 have been fashioned together, and with the elements or components, i.e., LEDs 40, 42, 44 and resistor 50 suitably located or disposed in topographical relationship with board 12, metal layers 14 and 16, protective plastic layers 18 and 20 are then forcefully applied onto the basic structure. Since the plastic material, forming the solder mask, which typically could be Dynachem Epic SP-100 (photoimageable), is processed in a heated state, it will be forced into the etched openings, thereby to isolate the various conductive elements. For example, the moats 40M and 42M will be achieved by forcing the respective material of layers 18 and 20 into the openings or grooves resulting from the etching of the metal layers. Likewise, for example, the annular openings 14X, 14Y and 14Z are filled in, as well as the openings 16W, 16X, 16Y and 16Z, with material from layer 20.

Figure 6:
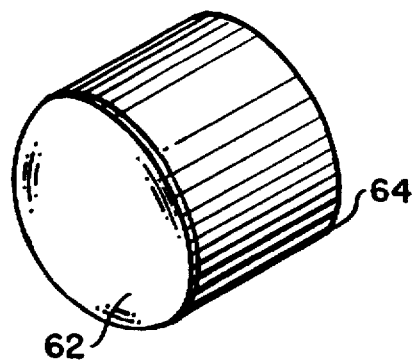
FIG. 6 is a perspective view of the housing for the LED light signal device.

It should be noted that in the event the modular integrated circuit arrangement is to be retro-fitted to already existing housings that have been used with conventional light signal units, adjustability in mounting of the module 10 seen in FIG. 1 is provided by reason of the integral bosses 60, which have bolt-receiving holes located at variable distances from the center of the module 10. Also, as seen in FIG. 6, an added feature of the invention provides resistance to vandalism resulting from hitting the light signal with baseball bats or the like. Thus, a clear piano protective lens 62, for example, of strong plastic material, such as LEXAN, can be used to replace the outer roundel found on the conventional housing 64 to form a retrofitted light signal.

Although the broad area ohmic contacts in the form of layers 14 and 16 have been shown as being continuous in nature, it will be appreciated that the FIG. 3 embodiment can be selected to conserve material and yet provide a high degree of resistance to circuit-severing vandalism. Instead of being continuous, the layers are created to have spaced strips 70 and a common connection means 72.

Figure 7:
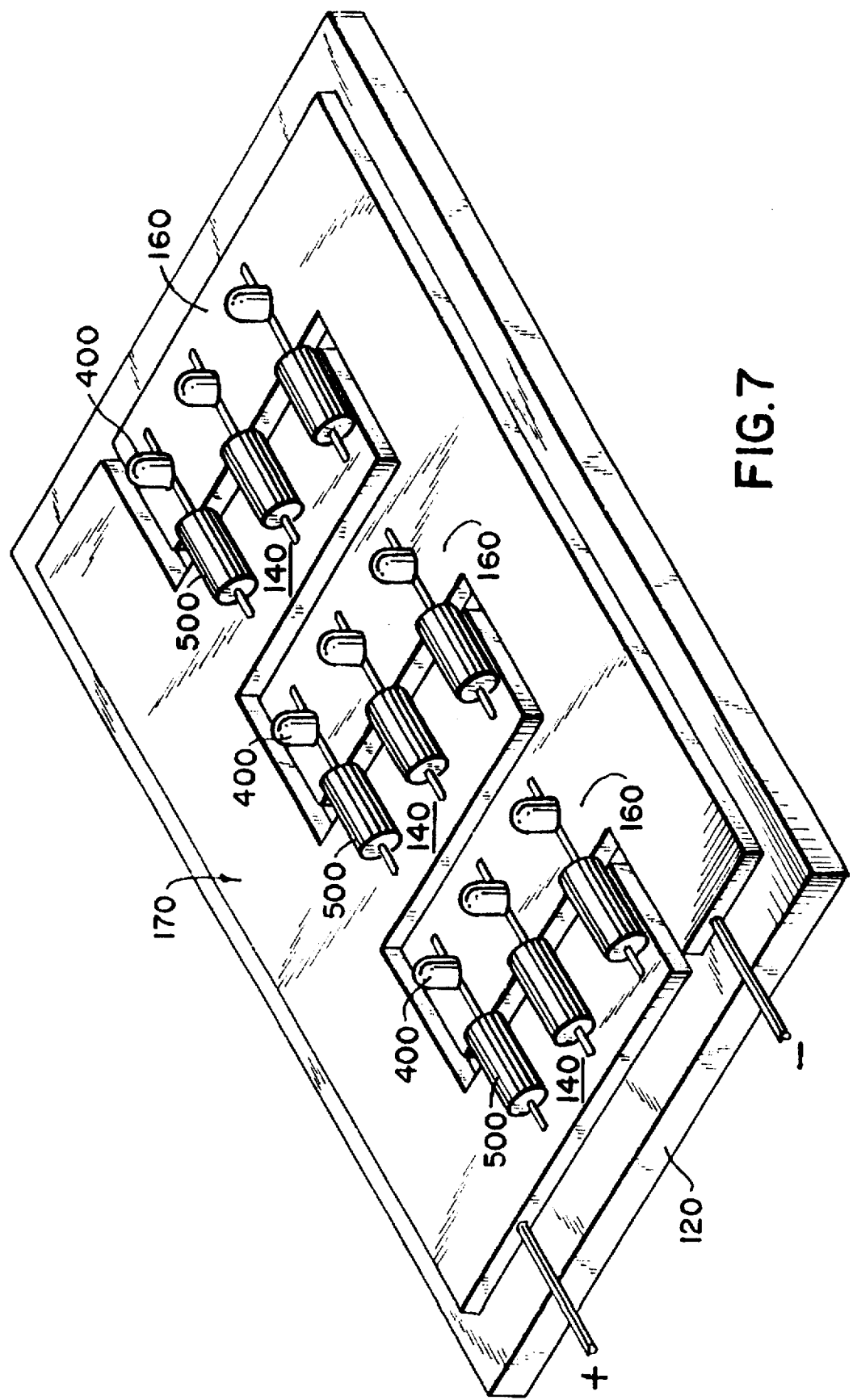
FIG. 7 is a schematic representation of an alternative embodiment of the invention in which a single broad area ohmic contact is formed on one side of an insulative circuit board.

Referring now to FIG. 7, an alternative embodiment of the invention is illustrated, in which a single broad area ohmic contact is formed on one side of an insulative circuit board. It will be noted that alternating positive conductors 140 and negative conductors 160 are formed from a single metallic ohmic layer 170 which overlays the insulative printed circuit board 120. Thus, in contrast with the first preferred embodiment, illustrated in FIGS. 1–6, only one layer 170 is required to overlay the circuit board, rather than the two layers 14 and 16 of FIGS. 1–6. This results from the fact that the single layer 170 is so formed as to provide alternating positive and negative conductors having continuous portions completely overlaying the insulative board 120 and, for example, in the embodiment of FIG. 7, interdigitating portions, with slight spacing, for accommodating the connection of LEDs 400 and resistors 500 in series—parallel circuits.

The invention having been thus described with particular reference to the preferred forms thereof, it will be obvious that various changes and modifications may be made therein without departing from the spirit and scope of the invention as defined in the appended claims.

We claim:

1. A vandal-resistant light signal unit comprising:

an integrated circuit module including an insulative circuit board, first and second broad area layers extending radially to the periphery of said module so as completely to overlay said circuit board; the first layer defining a positive energy plane serving as an ohmic contact, and the second layer defining a negative energy plane serving as another ohmic contact;

said broad area layers of conductive material being connected to opposite sides of a power supply;

a plurality of independent series circuits, each including at least one light emitting device located above said circuit board for radiating light to the ambient, said circuits being connected in parallel to respective spaced points on the first and second broad area layers of conductive material;

wherein said layers constitute a means for resisting the effects of vandalism occasioned by projectiles directed at said light signal unit.

2. A unit as defined in claim 1, in which said first and second broad area layers are on opposite sides of the circuit board.

3. A unit as defined in claim 2, in which each of the series circuits further includes a resistor.

4. A unit as defined in claim 3, in which two additional insulative layers are provided, one above said first conductive layer and the other below said second conductive layer.

5. A unit as defined in claim 4, further including islands of conductive material surrounded by insulative moats formed in said broad area layers of conductive material.

6. A unit as defined in claim 4, in which each of said broad area layers is substantially continuous except for said islands of conductive material which constitute leads for connection of components.

7. A vandal-resistant light signal unit as defined in claim 1, in which both the first and second broad area layers serving as ohmic contacts overlay the circuit board on one side thereof, the layers being formed to provide positive and negative conductors respectively.

8. A vandal-resistant light signal unit as defined in claim 7, in which the positive and negative conductors include interdigitating spaced strips.

* * * * *